United States Patent
Russell et al.

[11] Patent Number: 5,993,945
[45] Date of Patent: Nov. 30, 1999

[54] PROCESS FOR HIGH RESOLUTION PHOTOIMAGEABLE DIELECTRIC

[75] Inventors: David John Russell, Apalachin, N.Y.; Donald Herman Glatzel, New Milford, Pa.

[73] Assignee: International Business Machines Corporation, Armonk, N.Y.

[21] Appl. No.: 08/853,211

[22] Filed: May 8, 1997

Related U.S. Application Data

[63] Continuation-in-part of application No. 08/678,458, May 30, 1996, Pat. No. 5,665,650.

[51] Int. Cl.$^6$ ................................. B32B 3/00; G03C 3/00
[52] U.S. Cl. ........................ 428/209; 428/418; 428/901; 174/258; 174/262; 430/14; 430/18; 430/280.1
[58] Field of Search .................... 430/280, 18, 14, 430/280.1; 174/258, 262; 428/209, 418, 901

[56] References Cited

U.S. PATENT DOCUMENTS

| | | | |
|---|---|---|---|
| 4,448,804 | 5/1984 | Amelio et al. | 427/98 |
| 4,559,292 | 12/1985 | Geissler et al. | 430/256 |
| 4,581,308 | 4/1986 | Moriya et al. | 430/5 |
| 4,867,839 | 9/1989 | Sato et al. | 156/630 |
| 4,911,786 | 3/1990 | Kindl et al. | 156/659.1 |
| 4,940,651 | 7/1990 | Brown et al. | 430/325 |
| 4,983,252 | 1/1991 | Masui et al. | 156/630 |
| 4,992,354 | 2/1991 | Axon et al. | 430/258 |
| 5,026,624 | 6/1991 | Day et al. | 430/280 |
| 5,028,513 | 7/1991 | Murakami et al. | 430/315 |
| 5,164,284 | 11/1992 | Briguglio et al. | 430/258 |
| 5,208,067 | 5/1993 | Jones et al. | 427/96 |
| 5,264,325 | 11/1993 | Allen et al. | 430/280 |
| 5,278,010 | 1/1994 | Day et al. | 430/18 |
| 5,300,402 | 4/1994 | Card, Jr. et al. | 430/280 |
| 5,304,457 | 4/1994 | Day et al. | 430/280 |
| 5,391,458 | 2/1995 | Conrad | 430/258 |
| 5,437,960 | 8/1995 | Nagate et al. | 430/256 |
| 5,439,766 | 8/1995 | Day et al. | 430/280.1 |
| 5,439,779 | 8/1995 | Day et al. | 430/280 |
| 5,443,672 | 8/1995 | Stoll et al. | 156/244.17 |
| 5,557,844 | 9/1996 | Bhatt et al. | 29/852 |
| 5,595,858 | 1/1997 | Akama et al. | 430/318 |
| 5,665,650 | 9/1997 | Lauffer et al. | 437/195 |
| 5,667,934 | 9/1997 | Markovich et al. | 430/280.1 |

OTHER PUBLICATIONS

IBM Technical Disclosure Bulletin, vol. 36, No. 10, Oct. 1993, "Formation of Surface Laminar Circuit Printed Circuit Board with Plated Through Holes".
IBM Technical Disclosure Bulletin, vol. 14, No. 3, Aug. 1971, "Making Integral Multilayer Circuit Boards with Cable Connections".
IBM Technical Disclosure Bulletin, vol. 33, No. 7, Dec. 1990 "Improved Composition for a Dry Film Soldermask" by Day, et al.
IBM Technical Disclosure Bulletin, vol. 33, No. 7, Dec. 1990 "Improved Composition for a Dry Film Soldermask".

*Primary Examiner*—Deborah Jones
*Assistant Examiner*—Cathy F. Lam
*Attorney, Agent, or Firm*—William N. Hogg

[57] ABSTRACT

A novel process for circuitizing a dielectric layer, particularly for adding wiring planes, which is employed in the fabrication of circuitized structures, that does not requiring drilling of vias, yet provides good adhesion of circuitization to dielectric layer. In its broadest sense the method comprises the following steps: a. providing: a substrate; a hydrophobic, uncured, photoimagable, dielectric film having a solvent content of from about 5 to 30%; metal foil; b. contacting the metal foil and the dielectric film so that a replicate image is formed in the dielectric film; c. disposing the dielectric film on the substrate either after step a or step b; d. etching the metal foil from the dielectric film after step c; e. after step d, photoimaging the dielectric film to form vias or through holes in the dielectric film; and then metallizing the film after step e, to provide circuitization atop the dielectric film. The invention also relates to the circuitized structures produce by the method.

9 Claims, 3 Drawing Sheets

PROCESS FOR HIGH RESOLUTION PHOTOIMAGEABLE DIELECTRIC

RELATED APPLICATIONS

This is a Continuation-in-Part of application Ser. No. 08/678,458, filed May 30, 1996, now U.S. Pat. No. 5,665,650 dated Sep. 9, 1997.

BACKGROUND OF THE INVENTION

In the fabrication of multi-layered printed wiring board when an additional wiring plane is added to a circuitized substrate, an additional layer of dielectric is applied atop the existing circuitry on the substrate, and the additional circuitization is added atop the dielectric layer. To connect the circuitry atop the dielectric and the circuitry within the multi-layer, through holes and blind vias are drilled. Unfortunately, it is difficult to drill through holes and vias having a diameter smaller than about 10 mils. Thus such drilled through holes and vias consume real estate.

In an attempt to increase real estate, methods have been devised for forming smaller diameter through holes and blind vias. Laser drilling and laser ablation provide smaller diameter through holes and vias but they are time consuming and expensive.

Another method involves placing a photoimageable dielectric atop a substrate, photoimaging microvias, then plating circuitry atop the dielectric; however, it is typically difficult to get good adhesion of the circuitry to the dielectric; or where acceptable adhesion is obtained, it is achieved by roughening by chemical means, such as by a permanganate etch. Permanganate etchants are not desirable because they employ harsh chemical baths.

Another method has been developed, which involves laminating a dielectric layer having a metal layer atop, to a substrate, subtractive etching vias in the foil, then plasma etching out vias in the dielectric layer organic under foil. This is not only time consuming, but the line circuitry density is not satisfactory because small diameter vias are not achievable.

Accordingly, it would be desirable to have a method for adding additional wiring planes to substrates, which does not require mechanical drilling to form vias and through holes, and thus increases available real estate yet is efficient, does not require harsh etchants, and the circuitization in the additional wiring plane adheres to the dielectric layer.

SUMMARY OF THE INVENTION

The present invention provides a novel process for fabricating a circuitized dielectric layer, particularly wiring planes, which is employed in the fabrication of circuitized structures, that does not requiring drilling of vias or through holes, yet provides good adhesion of circuitization to dielectric layer. In its broadest sense the method comprises the following steps: a. providing: a substrate; a hydrophobic, uncured, photoimagable, dielectric film having a solvent content of from about 5 to 30%; metal foil; b. contacting the metal foil and the dielectric film so that a replicate image is formed in the dielectric film; c. disposing the dielectric film on the substrate either after step a or step b; d. etching the metal foil from the dielectric film after step c; e. after step d, photoimaging the dielectric film to form vias or through holes in the dielectric film; and then metallizing the film after step e, to provide circuitization atop the dielectric film.

The invention also relates to the circuitized structures produce by the method.

DETAILED DESCRIPTION OF THE INVENTION

Figure 1:
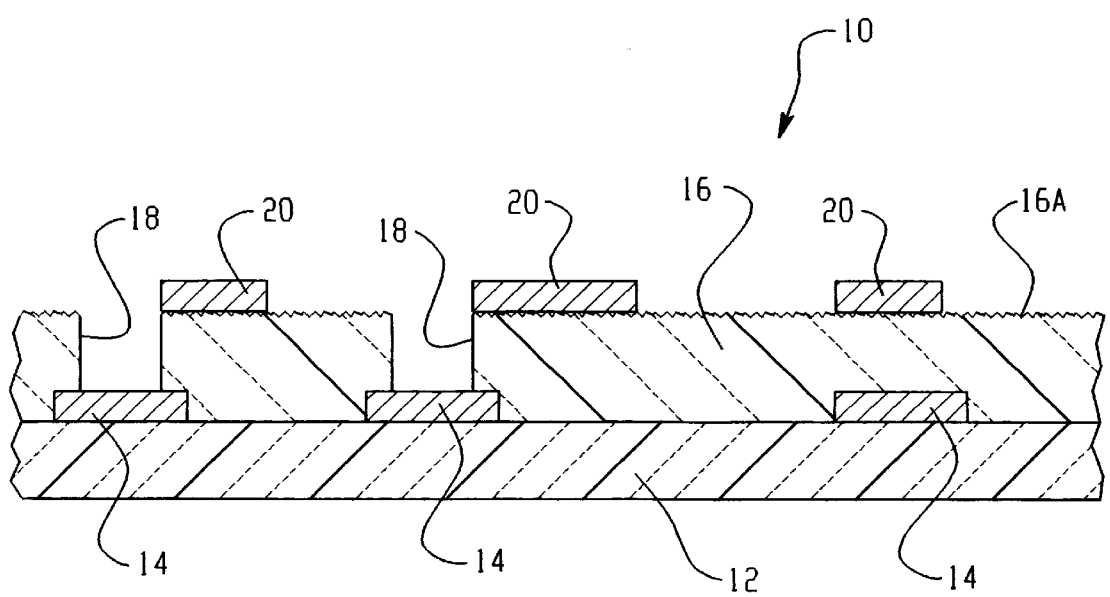
FIG. 1 shows a circuitized structure with the photoimaged dielectric film disposed on the substrate, vias and through holes disposed in the dielectric film and circuitization disposed on the dielectric film.

The present invention provides a novel process for fabricating a circuitized dielectric layer, particularly wiring planes, which is employed in the fabrication of circuitized structures, that does not requiring drilling of vias or through holes, yet provides good adhesion of circuitization to dielectric layer. In its broadest sense the method comprises the following steps: a. providing: a substrate; a hydrophobic, uncured, photoimagable, dielectric film having a solvent content of from about 5 to 30%; metal foil; b. contacting the metal foil and the dielectric film so that a replicate image is formed in the dielectric film; c. disposing the dielectric film on the substrate either after step a or step b; d. etching the metal foil from the dielectric film after step c; e. after step d, photoimaging the dielectric film to form vias or through holes in the dielectric film; and then metallizing the film after step e, to provide circuitization atop the dielectric film. The resulting circuitized structures include for example, circuit boards, cards, carriers, organic and inorganic single chip modules, organic or inorganic multi-chip modules, ceramic carriers and interposer cards.

The Method

A substrate is provided such as for example, non-circuitized power cores, stiffeners, circuitized substrates such as circuit boards, cards, carriers, organic and inorganic single chip modules, organic or inorganic multi-chip modules, ceramic carriers and interposer cards.

An uncured, photoimageable, dielectric is either applied to the substrate and then metal foil applied to the dielectric film to provide a foil-film-substrate, or the dielectric is applied to the metal foil to provide a foil-film assembly, and the foil-film assembly is then applied to the substrate to provide a foil-film-substrate.

Several techniques are useful to assemble the foil-film-substrate. In one method the uncured, photoimageable, dielectric is applied to the foil as a film, or as a liquid which dries to a film, then the foil-film is applied to the substrate, with film side of the foil-film in contact with the substrate. The other assembly methods involve applying the dielectric as a film, or as a liquid which dries to a film, to the substrate then applying the foil atop the film. One such method of assembly involves direct application of the dielectric film to the substrate, adding the foil atop the dielectric film. Another such method of assembly involves applying the dielectric film to a polymeric backing, such as polyester; inverting the dielectric film-backing onto the substrate, removing the backing, and applying the foil atop the dielectric film. Suitable polyester backings for the dielectric film, include, for example, polyethylene terephthalate available under the trade name MYLAR, from DuPont, and MELINEX from ICI.

The surface characteristics of the metal foil are formed, such as by impression, into the dielectric film; preferably by applying the metal foil with pressure and more preferably with pressure and elevated temperature. The preferred technique for impressing the surface characteristics of the metal foil to the dielectric film is by lamination, more preferably by vacuum lamination. The dielectric film is preferably disposed on the substrate during the point in which the surface characteristics of the metal foil are impressed on the dielectric film. During the application of the metal foil to the dielectric film, the dielectric film flows or deforms so as to conform to the surface of the metal foil. Thus the surface texture or characteristics of the metal foil are imparted to or impressed into, the surface of the dielectric film so that the surface of the dielectric film acquires such surface texture or characteristics and is thereby roughened. The dielectric film possesses the surface characteristics of the metal foil in a negative relief image, and is said to posses a "replicate surface".

The dielectric film, in the steps before photo-imaging, has an solvent content in an amount sufficient to prevent cracking and provide plasticity to the dielectric film during handling and to assist flow of the dielectric film during lamination with the metal foil. The solvent content in the dielectric film prior to lamination with the metal foil preferably is at least 3% and preferably at least less that 60%; preferably the solvent content ranges from about 5 to 30%, by weight, more preferably from about 9 to 15%, most preferably from about 11 to 13.5%.

An advantage of the method of the present invention, is that lamination at low temperatures such as below 100° C., and pressures below 16 psi, such as those used in vacuum lamination, are suitable to form a replicate image in the dielectric film. In contrast, conventional methods of forming replicate images in dielectric material with copper foil require lamination procedures which employ temperatures of typically of at least 150° C. and pressures of at least 100 psi.

Once the replicate surface has been formed in the dielectric film of the foil-film-substrate, the metal foil is etched from the dielectric film, using conventional aqueous etchants. The method offers the advantage of not requiring a permanganate etchant. Suitable etchants include, for example, cupric chloride, ferric chloride and sodium persulfate. Preferably the etching is done at a temperature which does not cause the dielectric film to reflow. Good results have been obtained by etching the copper foil at temperatures of about 25° C. to about 40° C. When the preferred embodiment of the dielectric film is employed it is preferred that the foil is etched in a two step etch process; the first step preferably employs cupric chloride or ferric chloride at less than about 75° C., preferably about 50° C., to 60° C., most preferably about 54° C. to remove the bulk of the metal foil. The second etch step preferably is conducted at a lower temperature than the first etch step and preferably employs sodium persulfate at preferably below 54° C., more preferably about 20° C., to 25° C., to remove the remaining thin layer of metal foil. The surface texture of the metal foil remains impressed on the surface of the dielectric film after the etching step. The dielectric film, even in its uncured, photoimageable form is not degraded by aqueous etchants. Solvent is then driven off from the dielectric film, so that preferably less than about 8%, more preferably less than about 3%, solvent remains in the dielectric film. The driving off of solvent renders the dielectric film rigid and resistant to reflow so that the replicate surface is preserved during subsequent processing steps. After the etching of the metal foil from the dielectric film, and preferably before the photoimaging step, the solvent is driven off from the dielectric film to provide a solvent content preferably less than about 8%, more preferably less than about 3%. The dielectric film is air dried, or to hasten the removal of the solvent, it is heated; however care is taken not to cause the dielectric film to reflow. Reflow can cause the dielectric film to lose the replicate image. The temperature which causes reflow depends upon the amount of solvent present in the dielectric film. Suitable techniques for driving off solvent include for example, ramp or step heating. For example, the solvent is driven off slowly by initially heating at low temperature such as about 50° C. and gradually increasing the temperature to about 125° C.; or the solvent is driven off by drying in a two step procedure such as for example drying at from about 400 to 70° C. then drying at a higher temperature such as for example 900 to 140° C., more preferably 900 to 120° C.

The dielectric film is then photo-imaged using conventional techniques. Preferably, the dielectric film is exposed to ultraviolet light through desired artwork which is preferably in contact with the dielectric film, to expose areas corresponding to the position of the desired through-holes and vias. The dielectric film is then baked to partially cure the dielectric film which has been exposed to the actinic radiation.

The dielectric film is then developed, preferably using propylene carbonate or butyrolactone to provide a photoimaged dielectric film, in which the dielectric film has through holes and/or vias disposed therein. The dielectric film is then finally cured, preferably in a two step process, first involving an exposure to ultraviolet light in the range of 250 to 400 nm, followed by a thermal cure. Good thermal cures have been obtained in a convection oven at 150° C. to 180° C. for 30 to 90 minutes. The cured, photoimaged, film retains the surface texture of the metal foil. The dielectric film is then metalized, preferably circuitized, by conventional techniques, preferably by seeding with colloidal palladium solution followed by electroless copper plating bath, followed by electrolytic plating bath and subtractive etching. Other conventional methods of forming circuitization may be employed, such as full additive pattern plating, or flash electroless plating followed by electrolytic pattern plating.

If additional circuitized dielectric layers such as, for example additional wiring planes are desired, the process is repeated by applying another dielectric film atop circuitization, followed by applying a metal foil atop the new dielectric film, forming a replicate image in the dielectric film, etching the metal foil and circuitizing.

The fabrication of the circuitized structure is completed employing conventional techniques.

As a result of the methods of the present invention, the circuitized structure is produced. As shown in FIG. 1, the circuitized structure 10, is comprised of: substrate 12, circuitization 14 disposed on substrate 12, a cured photoimaged, dielectric film 16 having roughened surface 16A (not to scale), having photopatterned vias 18, and ciruitization 20 disposed on and adherent to the photoimaged dielectric film 16. The circuitization 20 on the dielectric film 16 is electrically connected to the circuitization 14 on the substrate 12 by the photopatterned vias 18.

The Dielectric Film

Suitable photoimageable compositions for making the photoimageable dielectric film are disclosed in U.S. Pat. No. 5,026,624 to Day, et. al., issued Jun. 25, 1991 and U.S. Pat. No. 5,300,402 to Card, et al., issued Apr. 5, 1994; U.S. Pat. No. 5,264,325 to Allen, et al., issued Nov. 23, 1993, which are specifically incorporated herein by reference. Preferably the dielectric constant of the dielectric film is less than about 5, more preferably less than about 4. The dielectric film is hydrophobic and does not absorb significant water from aqueous etchants used to etch the copper foil.

The dielectric film of the preferred embodiment is comprised of solids and solvent. The solids are preferably comprised of: from about 10 to 80%, preferably from 20 to 40%, more preferably about 30%, of phenoxy polyol resin which is the condensation product of epichlorohydrin and bisphenol A, having a molecular weight of from about 40,000 to 130,000, preferably about 60,000 to 90,000, more preferably greater than 60,000; from about 20 to 90%, preferably from about 25 to 30%, most preferably about 25%, of an epoxidized multifunctional bisphenol A formaldehyde novolac resin having a molecular weight of from about 4,000 to 10,000, preferably about 5,000 to 7,000; from 0 to 50%, preferably from about 35 to 50%, more preferably 40 to 45%, most preferably about 45%, of a halogenated, preferably brominated, diglycidyl ether of bisphenol A having a molecular weight of from about 600 to 2,500, preferably about 1,000 to 1,700; and from about 0.1 to 15 parts, preferably about 5 parts, by weight of the total resin weight, a cationic photoinitiator. The solvent component of the dielectric film preferably is comprised of propyleneglycol monomethyl ether acetate and 0 to less than about 10% propylene carbonate. The propylene carbonate is preferably the carrier for the preferred photoinitiator.

Preferably the phenoxy polyol resin has an epoxide value of from about 0.001 to about 3, more preferably from about 0.01 to about 0.3, most preferably about 0.03 equivalents per kg, a weight per epoxide of from about 10,000 to about 60,000, more preferably from about 20,000 to about 50,000, most preferably about 37,000 and a glass transition temperature of from about 80 to about 150 more preferably from about 90 to about 110, most preferably about 98°C.

Preferably, the multifunctional epoxy bisphenol A formaldehyde novolac resin has an epoxide value of from about 1 to about 10 more preferably from about 3 to about 6, most preferably about 4.7 equivalents per kilogram, a weight per epoxide of from about 180 to about 300, more preferably from about 190 to about 230, most preferably about 215 and a melting point of from about 60 to about 150, more preferably from about 70 to about 90, most preferably about 82° C.

Preferably, the diglycidyl ether of the halogenated bisphenol A, has an epoxide value of from about 0.1 to about 5, more preferably from about 1 to about 3, most preferably about 1.5 equivalents per kilogram, a weight per epoxide of from about 200 to about 1000, more preferably from about 500 to about 750, most preferably about 675 and a melting point of from about 70 to about 150, more preferably from about 80 to about 110, most preferably about 97° C.

A suitable phenoxy polyol resin is available under the trade name "PKHC", formerly available from Union Carbide Corporation, now available from Phenoxy Resin Associates. A suitable octafunctional bisphenol A formerly available under the trade name Epirez SU-8 from High Tek Polymers, is now available as "Epon SU8" from Shell Chemical Company. A suitable tetrabromobisphenol A formerly available under the trade name "Epirez 5183" from High Tek Polymers, is now available as "Epon 1183" from Shell Chemical Company. A suitable complex triarylsulfonium hexafluoroantimonate salt photoinitiator formerly available under the trade name UVE 1014 from General Electric Company, is now available as UVI 6974 from Union Carbide Company.

The dielectric film is thermally stable particularly at lamination temperatures preferably up to at least 125° C. for 1 hour. The dielectric film even in the uncured state is resistant to the aqueous etchant used to etch the metal foil.

The Metal Foil

The metal foil, preferably copper foil, preferably has a thickness of from about 5 to 250 $\mu$m, more preferably from about 8 to 25 $\mu$m. Suitable copper foil is commercially available under the designation Grade 1 electrodeposited copper foil with a heavy oxide/zinc treatment from Gould, Inc., Eastlake, Ohio. Other suitable metal foils are electrodeposited copper foil and chrome/zinc silicate treated copper foils from Oak-Mitsui, Inc., Hoosick Falls, New York, and CFT-9 from Fukuda Metal Foil & Powder Co., Ltd., Kyoto, Japan. Electrodeposited metal films typically have one smooth side and one rough side; the rough side is the side that is impressed into the dielectric film herein.

The Seed Process

Processes for depositing seeder on a dielectric surface for plating are conventional and are described in U.S. Pat. No. 4,448,804 to Amelio, et al. The dielectric surfaces are typically cleaned with an alkaline solution. A multifunctional ionic copolymer is optionally deposited on the dielectric surface to enhance seeder coverage and adhesion. Next, the seeder is deposited by immersing the dielectric in a colloidal seed bath. Finally, the composition of the seeder is optionally altered by treatment with an acid or base solution.

The following examples are illustrative and not intended to limit the scope of the invention.

EXAMPLE 1

The photoimageable dielectric composition was prepared having a solids content of from about 86.5 to 89%, such solids comprising: about 27.44% PKHC a phenoxy resin; 41.16% of Epirez 5183 a tetrabromobisphenol A; 22.88% of Epirez SU-8, an octafunctional epoxy bisphenol A formaldehyde novolac resin, 4.85% UVE 1014 photoinitiator; 0.07% ethylviolet dye; 0.03% FC 430 a fluorinated polyether nonionic surfactant from 3M Company; 3.85% Aerosil 380, an amorphous silicon dioxide from Degussa. The solvent content is typically greater than about 20%. The solvent was a mixture of methyl ethyl ketone and propylene glycol monomethyl ether acetate.

The photoimageable dielectric composition was coated onto a 1.42 mil thick segment of polyethylene terephthalate designated Mylar D a polyester carrier from Dupont. The photoimageable dielectric composition was allowed to dry to provide a 2.8 mil thick photoimageable dielectric film on the polyethylene terephthalate carrier, to provide a solvent content of from about 11 to 13.5% of the total photoimageable dielectric composition. The dielectric film was then placed film side down onto a printed epoxy glass laminate circuit board having copper circuitry thereon and the dielectric film was laminated to the substrate using vacuum lamination. The backing was then peeled from the dielectric film. A half ounce, about 18 micron thick piece of copper foil was vacuum laminated onto the top surface of the dielectric film-substrate at 100° C., for a 90 second dwell time. The copper-film-substrate was cooled to room temperature, and placed in a spray etcher and spray etched with 2.8 M cupric chloride at about 54° C. for about 2 to 3 minutes, removed, and rinsed with distilled water. The circuit board with dielectric film and partially etched copper foil was then immersed in an etchant bath containing 20% sodium persulfate aqueous solution at room temperature for about 20 to 40 minutes to remove the remaining copper foil. The piece was then rinsed in distilled water and air dried for about 10 to 20 minutes to drive off water. The solvent was driven off in a two step process by first drying at about 50 to 70° C. for about 10 to 20 minutes, then drying at 100 to 140° C. for 10 to 30 minutes to drive off solvent, to provide a dry film composed of about 7% solvent and about 93% solids. The dielectric film-coated circuit board was placed under artwork, exposed to ultraviolet light from a UV lamp, for a total radiation dose of about 1000 mJ/cm$^2$. The dielectric film-coated circuit board was then baked at 125° C. for about 15 minutes, to partially cure the film. The dielectric film was then developed in gamma butyrolactone, rinsed in distilled water to provide a partially cured, photoimaged dielectric film having through holes or vias. The dielectric film was then further cured with ultraviolet light; the dielectric film received an exposure dose of about 4 J/cm$^2$. Then the dielectric film was finally cured at 150° C. for 60 minutes in an oven.

EXAMPLE 2

A dielectric film-substrate was prepared as in Example 1, except that the film was an electrodeposited copper foil with a heavy oxide/zinc treatment from Gould, Inc., Eastlake, Ohio. The foil was laminated to the dielectric film, then etched. The first etch was run at about at 54° C. and about 42–/minutes. The second etch was done in a spray tool containing 2.8 M CuCl$_2$ run at 32"/minutes at 25° C.

EXAMPLE 3

A dielectric film-substrate was prepared as in Example 2, except that after the etching, the dielectric film was then metallized. First, prior to the colloidal seeding, the dielectric film was subject to a cleaning step in which the dielectric film was cleaned with alkaline solution of sodium phosphate and sodium silicate at pH 13, and rinsed with HCl. The dielectric film was then seeded in a colloidal palladium solution, and then plated by immersing in an electroless copper plating bath, followed by immersing in an electrolytic plating bath.

EXAMPLE 4

A dielectric film-substrate was prepared as in Example 3, except that during the cleaning step, after the dielectric film-substrate was cleaned with the alkaline solution, it was then treated with a solution containing an ionic copolymer, then colloidal seed is applied and then rinsed with a NaOH solution.

EXAMPLE 5

A dielectric film-substrate was prepared as in Example 4, except that instead of being rinsed with sodium hydroxide, it was rinsed with a HCl solution.

EXAMPLE 6

A dielectric film-substrate was prepared as in Example 4, except that after the treatment with the ionic copolymer it was then treated with a sodium persulfate solution.

EXAMPLE 7

A dielectric film-substrate was prepared as in Example 1, except that a ½ oz. Fukuda copper foil was laminated to the dielectric film, then the foil-film was vacuum laminated to a panel.

Figure 2A:
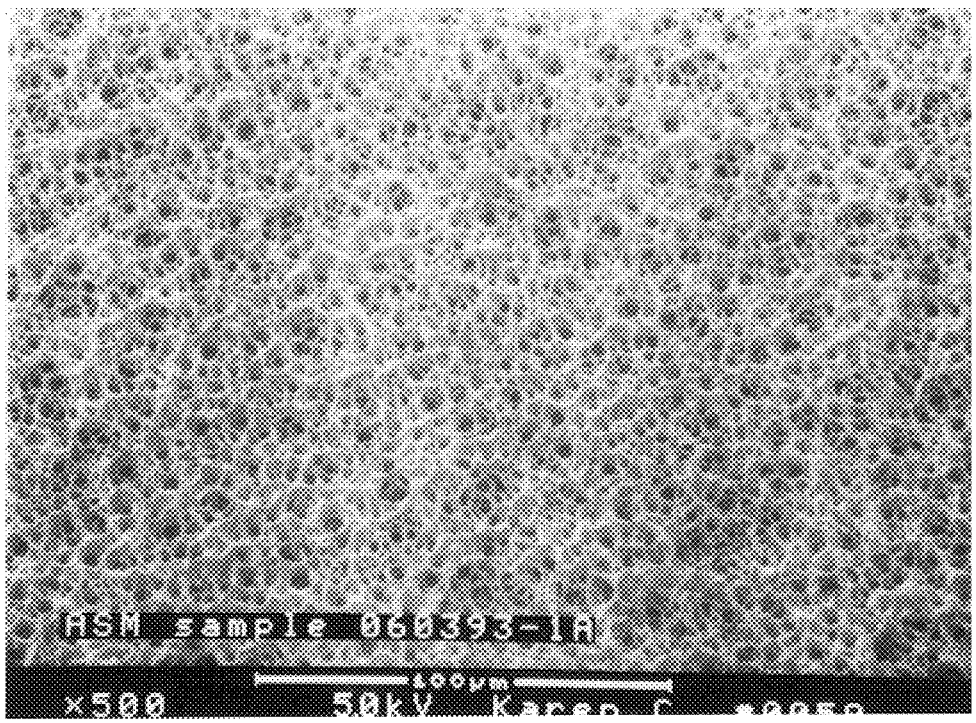
FIG. 2a is an electron micrograph showing the surface of a dielectric film according to the present invention, which has an impression left by copper foil; the copper foil had been laminated to the dielectric film then removed by etching, at 500× magnification and 25° angle.
Figure 2B:
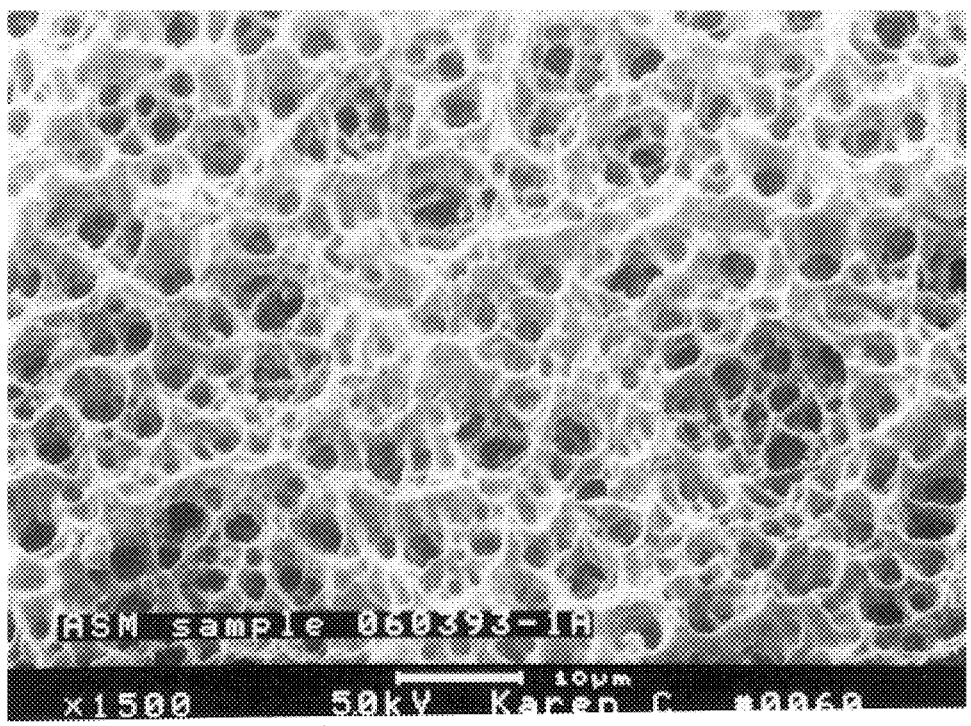
FIG. 2b is an electron micrograph showing the surface of a dielectric film according to the present invention, which has an impression left by copper foil; the copper foil had been laminated to the dielectric film then removed by etching, at 1500× magnification and 25° angle.
Figure 3A:
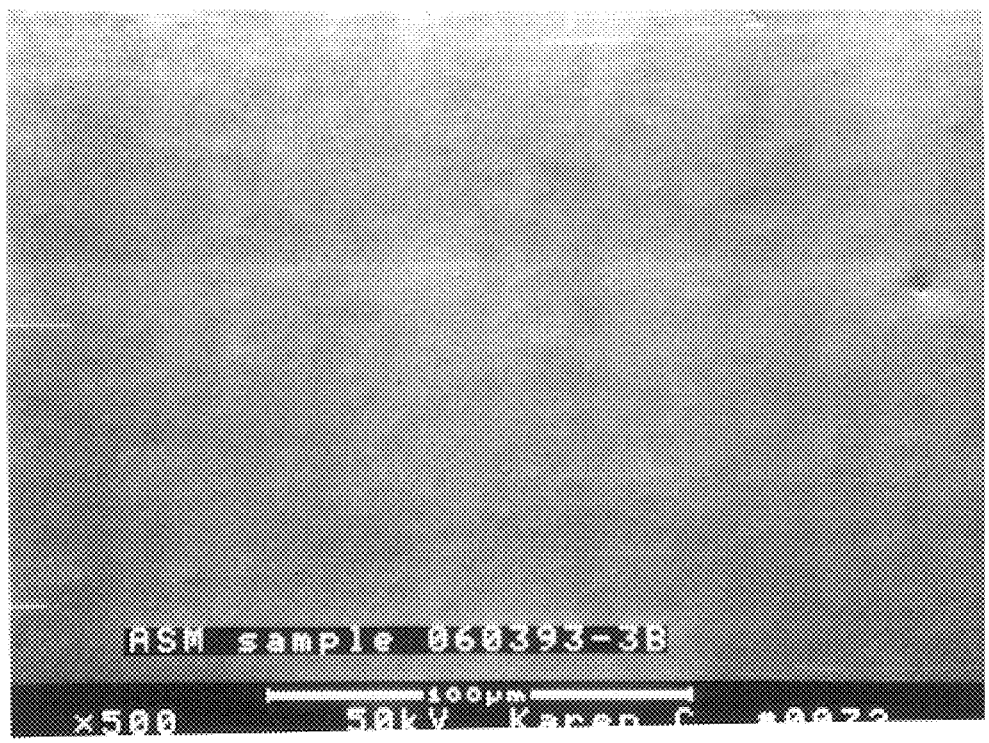
FIG. 3a is an electron micrograph showing the surface of a dielectric film not prepared according to the methods of the present invention, at 500× magnification and 25° angle.
Figure 3B:
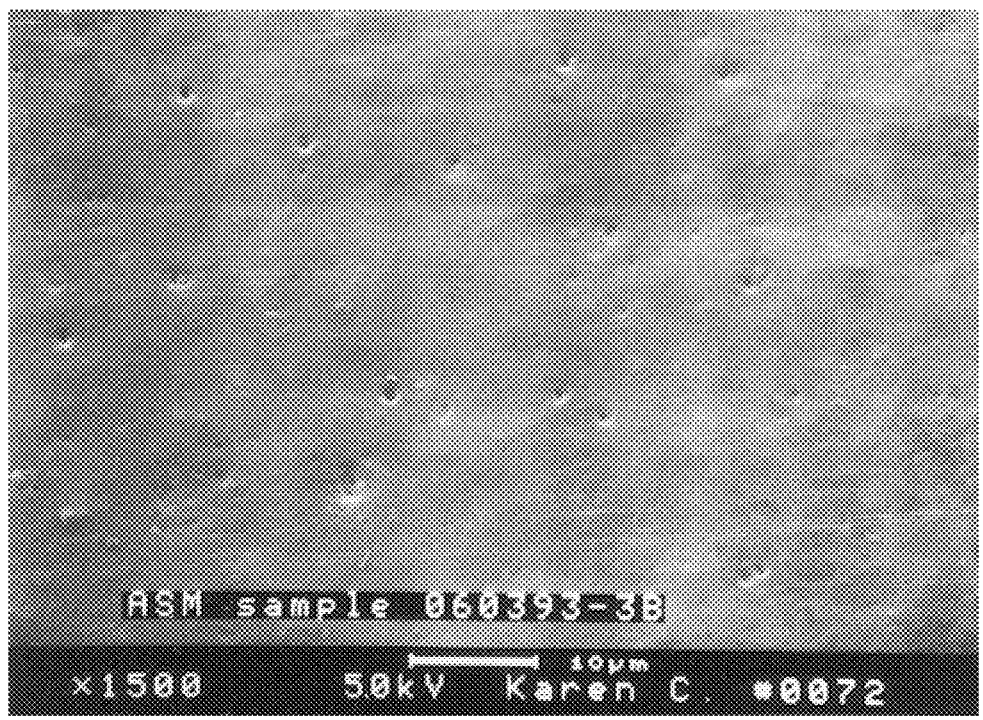
FIG. 3b is an electron micrograph showing the surface of a dielectric film not prepared according to the methods of the present invention, at 1500× magnification and 25° angle.

The surface characteristics of the dielectric films of examples 1, 2 and 7, after the etching of the copper foil, were examined by scanning electron microscopy. As can be seen in FIGS. 2a and 2b, the surface of the photoimageable dielectric film is roughened as a result of laminating the copper foil to the dielectric film. In contrast, as shown in FIGS. 3a and 3b, the surface of dielectric film which was not roughened with the copper foil, is smooth.

The adhesion of the metallization to the dielectric film in the samples prepared according to examples 3–6, were evaluated. The adhesion was determined by pulling copper metallization lying atop the dielectric with an tensile tester according to the procedure described in IPC-TM-650, method 2.4.8 Peel Strength of Metallic Clad Laminates, revision c, 12/1994, Institute for Interconnecting and Packaging Electronic Circuits, 7380 North Lincoln Ave., Lincolnwood, Ill. The adhesion values were determined to be typically greater than 2 pounds per inch, more typically at least about 3 pounds per inch. Specifically, the sample of example 3, had a peel strength of 2.3 lbs./inch. The sample of example 4, had a peel strength of 2.5 lbs./inch. The sample of example 5, had a peel strength of 3.4 lbs./inch. The sample of example 6, had a peel strength of 4.2 lbs./inch.

The invention is not limited to the embodiments which have just been described. The invention is intended by the following claims to include all technically equivalents which come within the full scope and true spirit of the invention.

Having thus described the invention, the invention is claimed as follows:

1. A circuitized structure comprising:
   a. a substrate having a first layer of circuitization upon the substrate;
   b. a cured, hydrophobic, photoimaged, dielectric film having a replicate surface, the dielectric film disposed on the substrate, the dielectric film comprising:
      i. from about 10 to 80% of phenoxy polyol resin which is the condensation product of epichlorohydrin and bisphenol A, having a molecular weight of from about 40,000 to 130,000;
      ii. from about 20 to 90% of an epoxidized multifunctional bisphenol A formaldehyde novolac resin having a molecular weight of from about 4,000 to 10,000;
      iii. from 0 to 50% of a halogenated diglycidyl ether of bisphenol A having a molecular weight of from about 600 to 2,500; and
      iv. less than 15% of a cationic photoinitiator; and less than about 8% solvent;
   c. photopatterned via holes or photopatterned through holes, disposed in the dielectric film, said vias or through holes having a diameter of less than about 10 mils;
   d. a second layer of circuitization, plated on, and adherent to the replicate surface of the dielectric film, the circuitization on the dielectric film being electrically connected to the circuitization disposed on the substrate by the photopatterned vias;
   wherein the second layer of circuitization has an adhesion value to the dielectric film of at least about 2 lbs/inch.

2. The circuitized structure of claim 1, wherein in the dielectric film there is
   a. from about 10 to 80% of phenoxy polyol resin which is the condensation product of epichlorohydrin and bisphenol A, having a molecular weight of from about 40,000 to 130,000;

b. from about 20 to 90% of an epoxidized multifunctional bisphenol A formaldehyde novolac resin having a molecular weight of from about 4,000 to 10,000;

c. from 0 to 50% of a halogenated diglycidyl ether of bisphenol A having a molecular weight of from about 600 to 2,500.

3. The circuitized structure of claim 1, wherein in the dielectric film there is:

a. from 20 to 40% of phenoxy polyol resin having a molecular weight of from about 60,000 to 90,000;

b. from about 25 to 30% of an epoxidized multifunctional bisphenol A formaldehyde novolac resin having a molecular weight of from about 5,000 to 7,000;

c. from about 35 to 50%, of a brominated diglycidyl ether of bisphenol A having a molecular weight of from about 1,000 to 1,700.

4. The circuit board of claim 1, wherein in the dielectric film there is:

a. about 30% of phenoxy polyol resin having an epoxide value of about 0.03 equivalents per kg, a weight per epoxide of about 37,000 and a glass transition temperature of about 98° C.;

b. about 25% of an octafunctional epoxy bisphenol A formaldehyde novolac resin having an epoxy value of about 4.7 equivalents per kilogram, as weight per epoxide of about 215 and a melting point of about 82° C.;

c. about 45% diglycidyl ether a tetrabromobisphenol A having an epoxide value of about 1.5 equivalents per kilogram, a weight per epoxide of about 675 and a melting point of about 97° C.; and d. about 5 parts by weight of the resin weight complex triarylsulfonium hexafluoroantimonate salt photoinitiator.

5. The circuitized structure of claim 1, wherein the hole diameter is 8 mils or less.

6. The circuitized structure of claim 1, wherein the circuitized structure is a circuit board, card, carrier, organic or inorganic single chip module, organic or inorganic multichip module, ceramic carrier or interposer card.

7. The circuitized structure of claim 1, wherein the circuitized structure is a printed circuit board.

8. The circuitized structure of claim 1, wherein the diglycidyl ether of bisphenol A is brominated.

9. A circuitized structure comprising:

a. a substrate having a first layer of circuitization upon the substrate;

b. a cured, photoimaged, dielectric film having a replicate surface, the dielectric film disposed on the substrate, the dielectric film comprising: less than 15% of a cationic photoinitiator; and less than about 8% solvent;

c. photopatterned via holes or photopatterned through holes, disposed in the dielectric film, said vias or through holes having a diameter of less than about 10 mils;

d. a second layer of circuitization plated on, and adherent to the replicate surface of the dielectric film, the circuitization on the dielectric film being electrically connected to the circuitization disposed on the substrate by the photopatterned vias;

wherein the second layer of circuitization has an adhesion value to the dielectric film of at least about 2 lbs/inch.

* * * * *